US012638605B2

(12) United States Patent
Kang et al.

(10) Patent No.: US 12,638,605 B2
(45) Date of Patent: May 26, 2026

(54) PLASMA LIGHT DETECTION SYSTEM INCLUDING A SCINTILLATING WINDOW

(71) Applicant: SAMSUNG ELECTRONICS CO., LTD., Suwon-si (KR)

(72) Inventors: Chansoo Kang, Suwon-si (KR); Daewon Kang, Suwon-si (KR); Minju Kim, Suwon-si (KR); Tae-Hyun Kim, Suwon-si (KR); Sang Ki Nam, Suwon-si (KR); Dougyong Sung, Suwon-si (KR); Jungmo Yang, Suwon-si (KR); Sejin Oh, Suwon-si (KR); Keonhee Lim, Suwon-si (KR); Junho Im, Suwon-si (KR)

(73) Assignee: Samsung Electronics Co. Ltd., Suwon-si (KR)

( * ) Notice: Subject to any disclaimer, the term of this patent is extended or adjusted under 35 U.S.C. 154(b) by 168 days.

(21) Appl. No.: 18/633,031

(22) Filed: Apr. 11, 2024

(65) Prior Publication Data

US 2025/0085445 A1 Mar. 13, 2025

(30) Foreign Application Priority Data

Sep. 12, 2023 (KR) ........................ 10-2023-0121365

(51) Int. Cl.
*G01T 1/36* (2006.01)
*G01T 1/20* (2006.01)
*H01L 21/67* (2006.01)
(52) U.S. Cl.
CPC ............ *G01T 1/362* (2013.01); *G01T 1/2002* (2013.01); *H01L 21/67253* (2013.01)
(58) Field of Classification Search
CPC . G01T 1/362; G01T 1/2002; H01L 21/67253; H01J 37/32972; H01J 37/32009; H01J 37/32119; G01J 1/58
See application file for complete search history.

(56) References Cited

U.S. PATENT DOCUMENTS 7,630,859 B2 12/2009 Harvey
11,114,286 B2 9/2021 Lin et al.
(Continued)

FOREIGN PATENT DOCUMENTS

CN 104977082 A 10/2015
CN 116735569 A 9/2023
(Continued)

OTHER PUBLICATIONS

Iglesias et al., "In situ measurement of VUV/UV radiation from low-pressure microwave-produced plasma in Ar/O2 gas mixtures," Measurement Science and Technology, Jul. 2017, vol. 28, No. 8, 12 pages.

(Continued)

*Primary Examiner* — Kiho Kim
(74) *Attorney, Agent, or Firm* — Fish & Richardson P.C.

(57) ABSTRACT

A substrate processing apparatus includes a process chamber providing a process space, a stage located in the process chamber and configured to support a substrate, a window coupled to a side of the process chamber, and a scintillator layer coupled to one side surface of the window. The scintillator layer covers a portion of the one side surface of the window which is less than the full window surface. A second surface corresponding to another portion of the one side surface of the window is exposed. Light emitted by a plasma in the process space passes through the window and is collected by an optical system and analyzed. Ultraviolet light passing through the scintillator is converted to longer wavelength, generally visible, light. Comparing the light passing through the bare window with the light passing through the scintillator layer enables analysis of the plasma.

20 Claims, 17 Drawing Sheets

(56) References Cited

U.S. PATENT DOCUMENTS

| 11,469,078 | B2 | 10/2022 | Tom et al. |
| 2009/0262414 | A1 | 10/2009 | Whitehead |
| 2009/0263919 | A1 | 10/2009 | Hori et al. |
| 2016/0379802 | A1 | 12/2016 | Oh et al. |
| 2019/0285470 | A1 | 9/2019 | Bezel et al. |

FOREIGN PATENT DOCUMENTS

| KR | 10-2008-0102273 | | 11/2008 | | |
| KR | 10-2008-0110600 | | 12/2008 | | |
| KR | 10-1169764 | | 7/2012 | | |
| KR | 10-2019415 | | 9/2019 | | |
| KR | 10-2117089 | | 5/2020 | | |
| KR | 20220100969 | A * | 7/2022 | ........... | G01J 5/0007 |
| KR | 10-2023-0000293 | | 1/2023 | | |
| TW | 202113312 | A | 4/2021 | | |

OTHER PUBLICATIONS

Han et al., "Real-time VUV radiation monitoring in low-pressure hydrogen plasma based on fluorescence of sodium salicylate," Meas. Sci. Technol., 2023, vol. 34, Article 025006, pp. 1-7.

* cited by examiner

PLASMA LIGHT DETECTION SYSTEM INCLUDING A SCINTILLATING WINDOW

CROSS-REFERENCE TO RELATED APPLICATION

This U.S. non-provisional patent application claims priority under 35 U.S.C. § 119 to Korean Patent Application No. 10-2023-0121365, filed on Sep. 12, 2023, in the Korean Intellectual Property Office, the disclosure of which is hereby incorporated by reference in its entirety.

BACKGROUND

A semiconductor device may be manufactured by various processes. For example, a semiconductor device may be manufactured by performing a photolithography process, an etching process, a deposition process, a plating process, etc. on a substrate. A plasma may be used to process a substrate in, for example, the etching process and/or the deposition process. Light generated from the plasma may be detected to check a state of the plasma in the process. For example, vacuum ultraviolet (VUV) light generated from the plasma may be detected to check the state of the plasma.

SUMMARY

Implementations of the present disclosure may provide a substrate processing apparatus, a substrate processing system including the same, a method of detecting a plasma using the substrate processing system and a method of processing a substrate using the substrate processing system, which are capable of monitoring a plasma using vacuum ultraviolet light (VUV).

Implementations of the present disclosure may also provide a substrate processing apparatus, a substrate processing system including the same, a method of detecting plasma using the substrate processing system and a method of processing a substrate using the substrate processing system, which are capable of detecting VUV light using an optical emission spectrometer (OES).

Implementations of the present disclosure may further provide a substrate processing apparatus, a substrate processing system including the same, a method of detecting plasma using the substrate processing system and a method of processing a substrate using the substrate processing system, which are capable of easily detecting VUV light by a simple design change.

Implementations of the present disclosure may further provide a substrate processing apparatus, a substrate processing system including the same, a method of detecting plasma using the substrate processing system and a method of processing a substrate using the substrate processing system, which are capable of detecting both visible light and VUV light emitted from plasma.

In an aspect, a substrate processing apparatus may include a process chamber providing a process space, a stage located in the process chamber and configured to support a substrate, a window coupled to a side of the process chamber, and a scintillator layer coupled to one side surface of the window. The scintillator layer, coupled to the one side surface of the window, may have an area less than an area of the one side surface of the window. A first surface corresponding to a portion of the one side surface of the window may be covered by the scintillator layer. A second surface corresponding to another portion of the one side surface of the window may be exposed.

In an aspect, a substrate processing system may include a substrate processing apparatus, and a detection apparatus configured to detect a plasma in the substrate processing apparatus. The substrate processing apparatus may include a process chamber providing a process space, a window coupled to the process chamber, and a scintillator layer used to convert vacuum ultraviolet light (VUV) emitted from the plasma in the process space into visible light. The detection apparatus may include a first light transmitting unit coupled to the substrate processing apparatus to transmit a portion of light emitted from the process chamber, which is transmitted through the scintillator layer, and a second light transmitting unit coupled to the substrate processing apparatus to transmit another portion of the light emitted from the process chamber, which is transmitted through the window but is not transmitted through the scintillator layer.

In an aspect, a method of processing a substrate may include disposing a substrate in a substrate processing apparatus, processing the substrate using a plasma in the substrate processing apparatus, and detecting the plasma in the substrate processing apparatus. The substrate processing apparatus may include a process chamber providing a process space, a window coupled to the process chamber, and a scintillator layer capable of transmitting light emitted from the plasma in the process space. The detecting of the plasma may include detecting a first light which is emitted from the plasma and is transmitted through the scintillator layer, detecting a second light which is emitted from the plasma, is transmitted through the window and is not transmitted through the scintillator layer, and comparatively analyzing the first light and the second light.

In an aspect, a method of detecting plasma may include detecting light, emitted from plasma in a substrate processing apparatus, by using a detection apparatus, and analyzing the light. The substrate processing apparatus may include a process chamber providing a process space, a window coupled to the process chamber, and a scintillator layer coupled to the window. The detecting of the light may include detecting a first light which is emitted from the plasma and is transmitted through the window and the scintillator layer, and detecting a second light which is emitted from the plasma, is transmitted through the window and is not transmitted through the scintillator layer. The analyzing of the light may include calculating an intensity of vacuum ultraviolet light (VUV), emitted from the plasma, by subtracting data of the second light from data of the first light.

DETAILED DESCRIPTION

Figure 1:
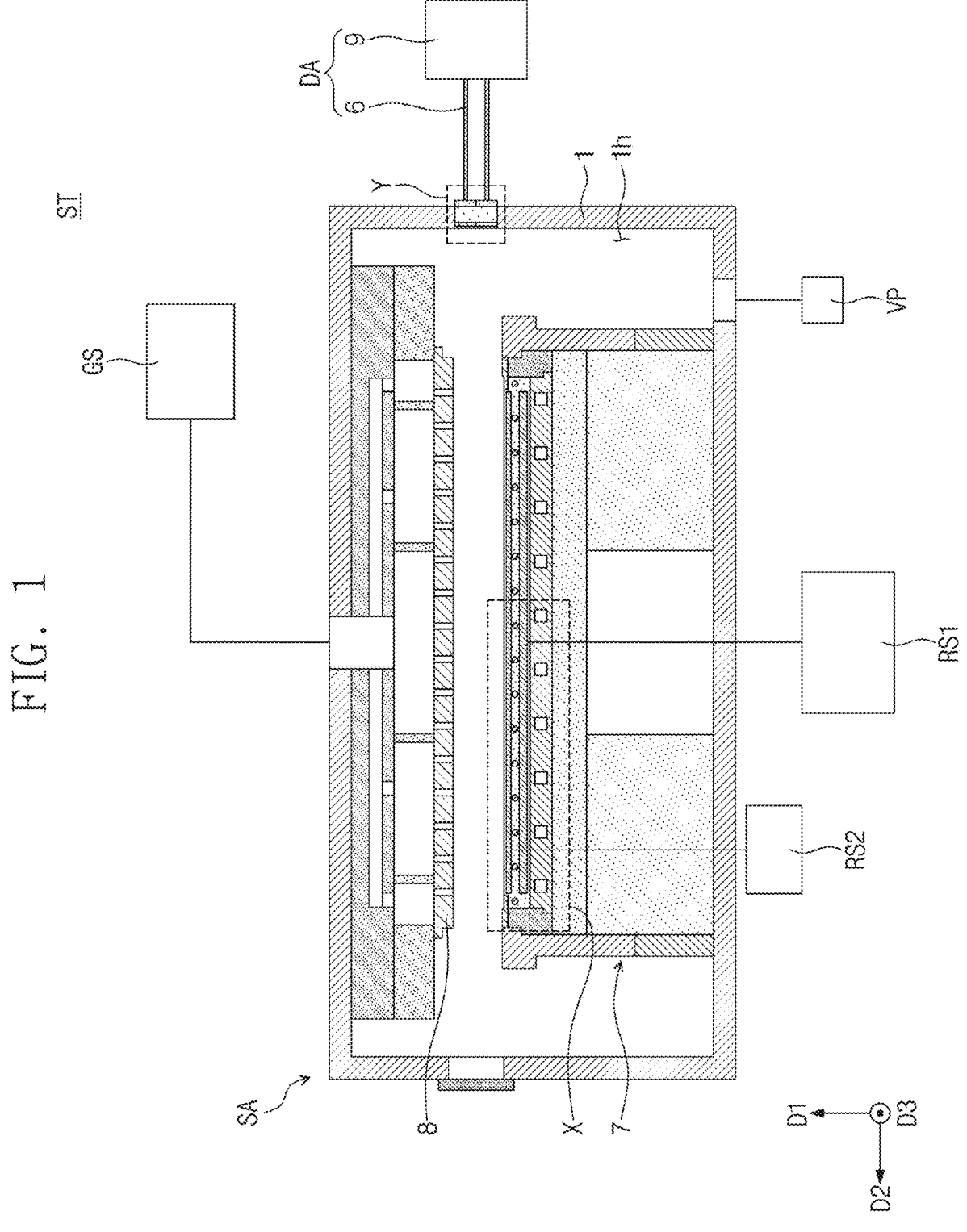
FIG. 1 is a cross-sectional view illustrating an exemplary substrate processing system.

Hereinafter, implementations will be described in detail with reference to the accompanying drawings. The same reference numerals or the same reference designators may denote the same components or elements throughout the specification.

FIG. 1 is a cross-sectional view illustrating a substrate processing system.

Hereinafter, a reference designator D1 may be referred to as a first direction, a reference designator D2 intersecting the first direction D1 may be referred to as a second direction, and a reference designator D3 intersecting both the first direction D1 and the second direction D2 may be referred to as a third direction. The first direction D1 may be referred to as a vertical direction. In addition, each of the second direction D2 and the third direction D3 may be referred to as a horizontal direction.

Referring to FIG. 1, a substrate processing system ST may be provided. The substrate processing system ST may be configured to process a substrate using a plasma. More particularly, the substrate processing system ST may be configured to perform an etching process and/or a deposition process on a substrate. In the present specification, the substrate used herein may mean, but not be limited to, a silicon (Si) wafer. The substrate processing system ST may include a substrate processing apparatus SA and a detection apparatus DA.

The substrate processing apparatus SA may be configured to generate a plasma. The substrate processing apparatus SA may be configured to generate the plasma by at least one of various methods. For example, the substrate processing apparatus SA may be a capacitively coupled plasma (CCP) apparatus and/or an inductively coupled plasma (ICP) apparatus. However, the substrate processing apparatus SA corresponding to the CCP apparatus will be described hereinafter for the purpose of ease and convenience in explanation and illustration. The substrate processing apparatus SA may include a process chamber 1, a stage 7, a shower head 8, a window 3 (see FIG. 3), a scintillator layer 2 (see FIG. 3), a shield layer 4 (see FIG. 3), a DC power generating unit RS2, a RF power generating unit RS1, a vacuum pump VP, and a gas supply unit GS.

The process chamber 1 may provide a process space 1h. A process may be performed on the substrate in the process space 1h. The process space 1h may be isolated from an external space. While the process is performed on the substrate, the process space 1h may be in a substantial vacuum state. The process chamber 1 may have, but is not limited to, a cylindrical shape.

The stage 7 may be located in the process chamber 1. In other words, the stage 7 may be located in the process space

1h. The stage 7 may be configured to support and/or hold the substrate. In a state in which the substrate is placed on the stage 7, the process may be performed on the substrate. The stage 7 will be described below in more detail.

The shower head 8 may be located in the process chamber 1. In other words, the shower head 8 may be located in the process space 1h. The shower head 8 may be spaced upward from the stage 7. The shower head 8 may provide gas holes. A gas supplied from the gas supply unit GS may be uniformly injected into the process space 1h through the shower head 8.

The window 3 (see FIG. 3) may be coupled to the process chamber 1. The window 3 will be described below in more detail.

The scintillator layer 2 (see FIG. 3) may be coupled to the window 3. For example, the scintillator layer 2 may be coupled to one side surface of the window 3. The scintillator layer 2 will be described below in more detail.

The shield layer 4 (see FIG. 3) may be located between the window 3 and the process space 1h. The shield layer 4 will be described below in more detail.

The DC power generating unit RS2 may be configured to apply DC power to the stage 7. The substrate may be held or fixed at a certain position on the stage 7 by the DC power applied by the DC power generating unit RS2.

The RF power generating unit RS1 may be configured to supply RF power to the stage 7. Thus, the plasma in the process space 1h may be generated and/or controlled. This will be described below in more detail.

The vacuum pump VP may be connected to the process space 1h. While the process is performed on the substrate, a vacuum pressure may be applied to the process space 1h by the vacuum pump VP.

The gas supply unit GS may be configured to supply a gas into the process space 1h. To achieve this, the gas supply unit GS may include a gas tank, a compressor, and a valve. A portion of the gas supplied into the process space 1h by the gas supply unit GS may be formed into the plasma.

The detection apparatus DA may be configured to detect the plasma in the substrate processing apparatus SA. To achieve this, the detection apparatus DA may be connected to the substrate processing apparatus SA. The detection apparatus DA may be configured to detect light emitted from the plasma in the substrate processing apparatus SA. To achieve this, the detection apparatus DA may include a light transmitting unit 6 and an optical emission spectrometer (OES) 9. The light transmitting unit 6 may be coupled to the substrate processing apparatus SA. The light transmitting unit 6 may be configured to transmit the light, emitted from the plasma in the substrate processing apparatus SA, to the OES 9. The OES 9 may be configured to analyze the light. The OES 9 may be connected to the light transmitting unit 6. For example, the OES 9 may include a 2-channel OES, but embodiments of the inventive concepts are not limited thereto. This will be described below in more detail.

Figure 2:
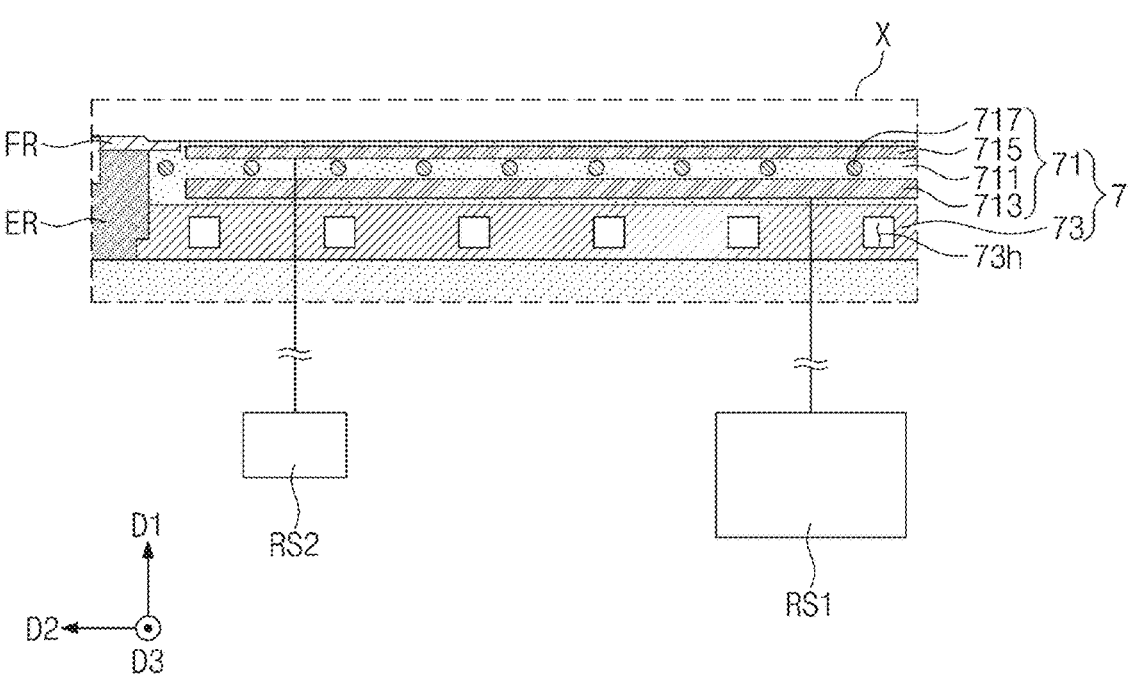
FIG. 2 is an enlarged cross-sectional view of a region 'X' of FIG. 1.

FIG. 2 is an enlarged cross-sectional view of a region 'X' of FIG. 1.

Referring to FIG. 2, the stage 7 may include a chuck 71 and a cooling plate 73.

The substrate may be disposed on the chuck 71. The chuck 71 may hold or fix the substrate at a certain position. To achieve this, the chuck 71 may include a chuck body 711, a plasma electrode 713, a chuck electrode 715, and a heater 717.

The chuck body 711 may have a cylindrical shape. The chuck body 711 may include ceramics, but embodiments of the inventive concepts are not limited thereto. The substrate may be disposed on a top surface of the chuck body 711. A focus ring FR and/or an edge ring ER may surround the chuck body 711.

The plasma electrode 713 may be located in the chuck body 711. For example, the plasma electrode 713 may include aluminum (Al). The plasma electrode 713 may have, but not be limited to, a disc shape. RF power may be applied to the plasma electrode 713. More particularly, the RF power generating unit RS1 may apply the RF power to the plasma electrode 713. The plasma in the process space 1*h* (see FIG. 1) may be controlled by the RF power applied to the plasma electrode 713.

The chuck electrode 715 may be located in the chuck body 711. The chuck electrode 715 may be located above the plasma electrode 713. DC power may be applied to the chuck electrode 715. More particularly, the DC power generating unit RS2 may apply the DC power to the chuck electrode 715. The substrate on the chuck body 711 may be held or fixed at a certain position by the DC power applied to the chuck electrode 715. The chuck electrode 715 may include, but not limited to, aluminum (Al).

The heater 717 may be located in the chuck body 711. The heater 717 may be located between the chuck electrode 715 and the plasma electrode 713. The heater 717 may include a heating wire. For example, the heater 717 may include concentric heating wires. The heater 717 may be configured to emit heat to the surrounding. Thus, a temperature of the chuck body 711 may rise.

The cooling plate 73 may be located under the chuck 71. In other words, the chuck 71 may be located on the cooling plate 73. The cooling plate 73 may provide a cooling hole 73*h*. Cooling water may flow through the cooling hole 73*h*. The cooling water in the cooling hole 73*h* may absorb heat from the cooling plate 73.

Figure 3:
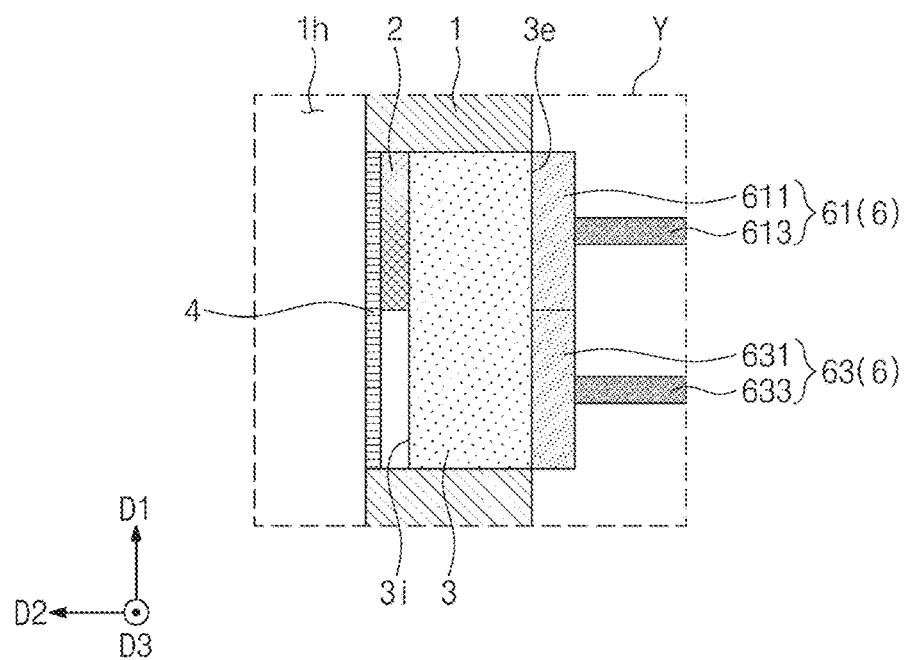
FIG. 3 is an enlarged cross-sectional view of a region 'Y' of FIG. 1.
Figure 4:
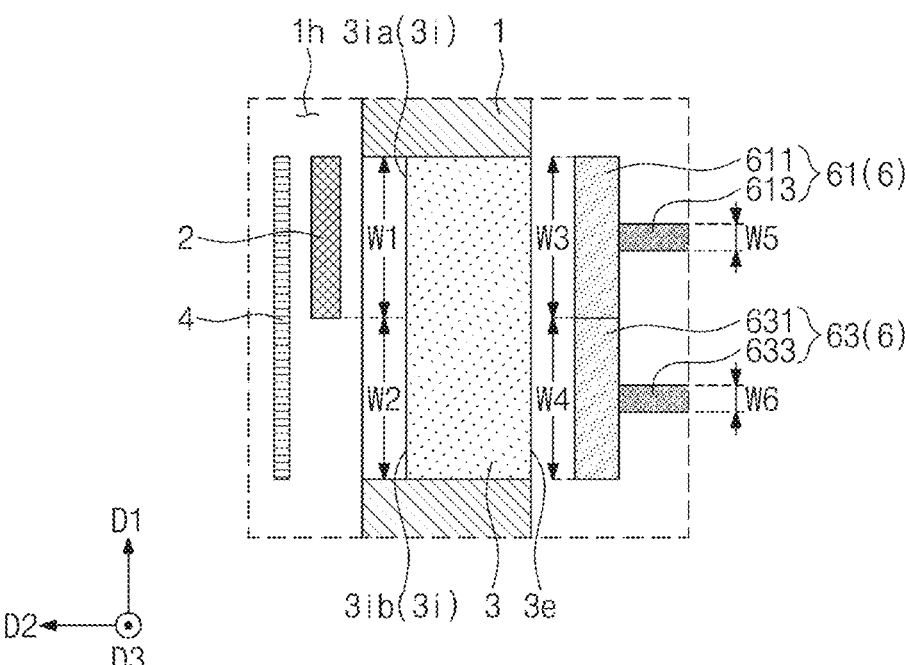
FIG. 4 is an exploded cross-sectional view of FIG. 3.

FIG. 3 is an enlarged cross-sectional view of a region 'Y' of FIG. 1, and FIG. 4 is an exploded cross-sectional view of FIG. 3.

Referring to FIGS. 3 and 4, the window 3 may be coupled to a side surface of the process chamber 1. The window 3 may be configured to transmit at least a portion of light in the process space 1*h*. For example, the window 3 may have a rectangular shape. More particularly, the window 3 may have the rectangular shape when viewed in the second direction D2. However, embodiments of the inventive concepts are not limited thereto. An inner side surface 3*i* of the window 3 may face the process space 1*h*. An outer side surface 3*e* of the window 3 may be opposite to the inner side surface 3*i*. For example, the window 3 may include quartz. In this case, the window 3 may be configured to transmit visible light. The window 3 may not transmit vacuum ultraviolet light (VUV). In other words, the VUV generated in the process space 1*h* may not pass through the window 3. The window 3 is coupled to the side surface of the process chamber 1 in the present embodiments, but embodiments of the inventive concepts are not limited thereto. In certain embodiments, the window 3 may be coupled to a top and/or a bottom of the process chamber 1.

The scintillator layer 2 may be capable of transmitting light. The scintillator layer 2 may be capable of converting light. For example, the scintillator layer 2 may convert the VUV into the visible light. The VUV generated in the process space 1*h* may be converted into the visible light while passing through the scintillator layer 2. To achieve this, the scintillator layer 2 may include a scintillator material. For example, the scintillator layer 2 may include sodium salicylate (NaSal). However, embodiments of the inventive concepts are not limited thereto, and in certain embodiments, the scintillator layer 2 may include another material capable of converting the VUV into the visible light.

The scintillator layer 2 may be coupled to the window 3. More particularly, the scintillator layer 2 may be coupled to one side surface of the window 3. The one side surface of the window 3, to which the scintillator layer 2 is coupled, may be the inner side surface 3*i* of the window 3. The scintillator layer 2 may be in contact with the inner side surface 3*i* of the window 3. More particularly, the scintillator layer 2 may be coated on the inner side surface 3*i* of the window 3. However, embodiments of the inventive concepts are not limited thereto, and in certain embodiments, the coupling relationship between the scintillator layer 2 and the window 3 may be realized in another shape. For example, the scintillator layer 2 may be spaced apart from the inner side surface 3*i* of the window 3 by a certain distance.

The scintillator layer 2 may cover only a portion of the inner side surface 3*i* of the window 3. In other words, an area of the scintillator layer 2 coupled to the inner side surface 3*i* of the window 3 may be less than an area of the inner side surface 3*i* of the window 3. Thus, the portion of the inner side surface 3*i* of the window 3 may be covered by the scintillator layer 2. Another portion of the inner side surface 3*i* of the window 3 may not be covered by the scintillator layer 2. In other words, the other portion of the inner side surface 3*i* of the window 3 may be exposed. The portion of the inner side surface 3*i* of the window 3, covered by the scintillator layer 2, may be referred to as a first surface 3*ia*. The other portion of the inner side surface 3*i* of the window 3, not covered by the scintillator layer 2, may be referred to as a second surface 3*ib*. The first surface 3*ia* may be covered by the scintillator layer 2. The second surface 3*ib* may be exposed. An area of the first surface 3*ia* may be substantially equal or similar to an area of the second surface 3*ib*. In this case, as shown in FIG. 4, a height W1 of the first surface 3*ia* may be substantially equal or similar to a height W2 of the second surface 3*ib*. In other words, the scintillator layer 2 may cover a half of the window 3. More particularly, the scintillator layer 2 may cover a half of the inner side surface 3*i* of the window 3. However, embodiments of the inventive concepts are not limited thereto.

The scintillator layer 2 is coupled to the inner side surface 3*i* of the window 3 in the above descriptions, but embodiments of the inventive concepts are not limited thereto. In certain embodiments, the scintillator layer 2 may be coupled to the outer side surface 3*e* of the window 3. This will be described below in more detail.

The shield layer 4 may be located between the process space 1*h* and the window 3. The shield layer 4 may prevent a polymer from being deposited on the window 3. In other words, the shield layer 4 may protect the inner side surface 3*i* of the window 3. The shield layer 4 may have a slit structure. In some embodiments, the shield layer 4 may be spaced apart from the window 3 in a horizontal direction. However, embodiments of the inventive concepts are not limited thereto, and in certain embodiments, at least a portion of the shield layer 4 may be in contact with the window 3.

The light transmitting unit 6 may transmit light emitted from the process space 1*h* to the OES 9 (see FIG. 1). The light transmitting unit 6 may include a first light transmitting unit 61 and a second light transmitting unit 63.

The first light transmitting unit 61 may be coupled to the substrate processing apparatus SA (see FIG. 1). More particularly, the first light transmitting unit 61 may be coupled to the substrate processing apparatus SA to transmit light transmitted through the scintillator layer 2. For this, the first light transmitting unit 61 may include a first collimator 611 and a first optical cable 613.

The first collimator 611 may be coupled to the window 3. More particularly, the first collimator 611 may be coupled to the outer side surface 3e of the window 3. The first collimator 611 may be coupled to the window 3 to overlap with the scintillator layer 2.

The first optical cable 613 may connect the first collimator 611 to the OES 9. In other words, one end of the first optical cable 613 may be coupled to the first collimator 611, and another end of the first optical cable 613 may be coupled to the OES 9. The first optical cable 613 may include an optical fiber.

The second light transmitting unit 63 may be coupled to the substrate processing apparatus SA (see FIG. 1). More particularly, the second light transmitting unit 63 may be coupled to the substrate processing apparatus SA to transmit light transmitted through the window 3. More particularly, the second light transmitting unit 63 may be coupled to the substrate processing apparatus SA to transmit light transmitted through the window 3 but not transmitted through the scintillator layer 2. For this, the second light transmitting unit 63 may include a second collimator 631 and a second optical cable 633.

The second collimator 631 may be coupled to the window 3. More particularly, the second collimator 631 may be coupled to the outer side surface 3e of the window 3. The second collimator 631 may be coupled to the window 3 not to overlap with the scintillator layer 2.

The second optical cable 633 may connect the second collimator 631 to the OES 9. In other words, one end of the second optical cable 633 may be coupled to the second collimator 631, and another end of the second optical cable 633 may be coupled to the OES 9. The second optical cable 633 may include an optical fiber.

An area of the first collimator 611 may be substantially equal or similar to an area of the second collimator 631. In this case, a height W3 of the first collimator 611 may be substantially equal or similar to a height W4 of the second collimator 631.

An area of the first optical cable 613 may be substantially equal or similar to an area of the second optical cable 633. In this case, a height W5 of the first optical cable 613 may be substantially equal or similar to a height W6 of the second optical cable 633. The area of the scintillator layer 2 may be greater than the area of the first optical cable 613.

The single window 3 is provided in the above descriptions, but embodiments of the inventive concepts are not limited thereto. In certain embodiments, two windows may be provided. In this case, the scintillator layer 2 may be coupled to one of the two windows. This will be described below in more detail.

Figure 5:
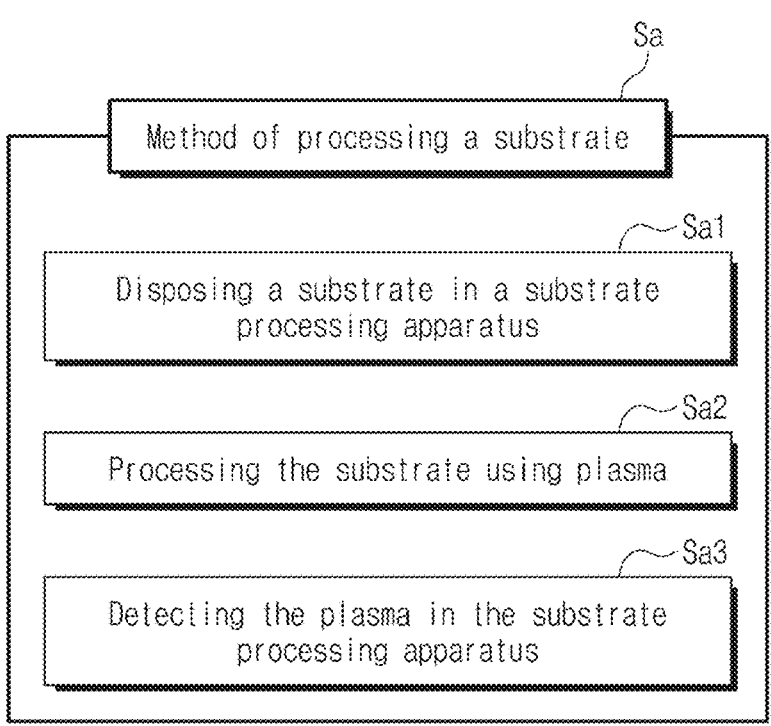
FIG. 5 is a flow chart illustrating an example method of processing a substrate.

FIG. 5 is a flow chart illustrating a method of processing a substrate.

Referring to FIG. 5, a method of processing a substrate (Sa) may be provided. The method of processing a substrate (Sa) may be a method of processing a substrate using the substrate processing system ST (see FIG. 1) described with reference to FIGS. 1 to 4. For this, the method of processing a substrate (Sa) may include disposing a substrate in a substrate processing apparatus (Sa1), processing the substrate using plasma (Sa2), and detecting the plasma in the substrate processing apparatus (Sa3).

Figure 6:
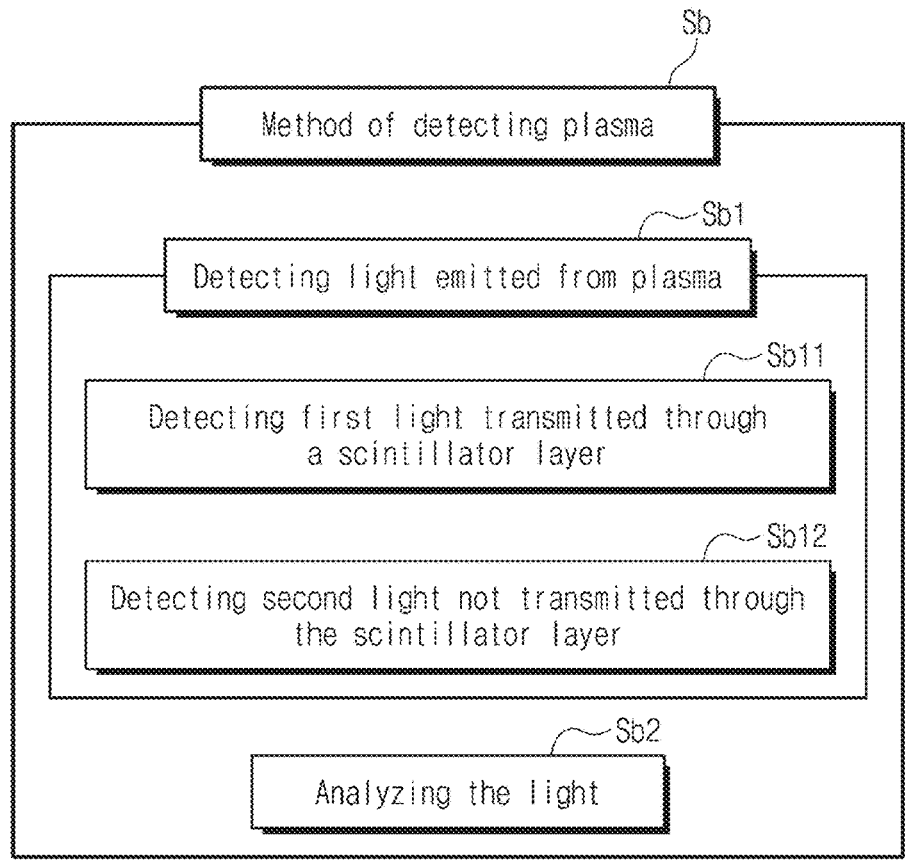
FIG. 6 is a flow chart illustrating an example method of detecting plasma.

FIG. 6 is a flow chart illustrating a method of detecting plasma.

Referring to FIG. 6, a method of detecting plasma (Sb) may be provided. The method of detecting plasma (Sb) may be a method of detecting the plasma in the substrate processing apparatus SA (see FIG. 3). More particularly, the method of detecting plasma (Sb) may be a method of performing the detecting of the plasma in the substrate processing apparatus (Sa3) described with reference to FIG. 5. For this, the method of detecting plasma (Sb) may include detecting light emitted from plasma (Sb1) and analyzing the light (Sb2).

The detecting of the light emitted from the plasma (Sb1) may include detecting a first light transmitted through a scintillator layer (Sb11) and detecting a second light not transmitted through the scintillator layer (Sb12).

Hereinafter, the method of processing a substrate (Sa) in FIG. 5 and the method of detecting plasma (Sb) in FIG. 6 will be described in detail with reference to FIGS. 7 to 14.

FIGS. 7 to 11 are views illustrating the method of processing a substrate according to the flow chart of FIG. 5.

Figure 7:
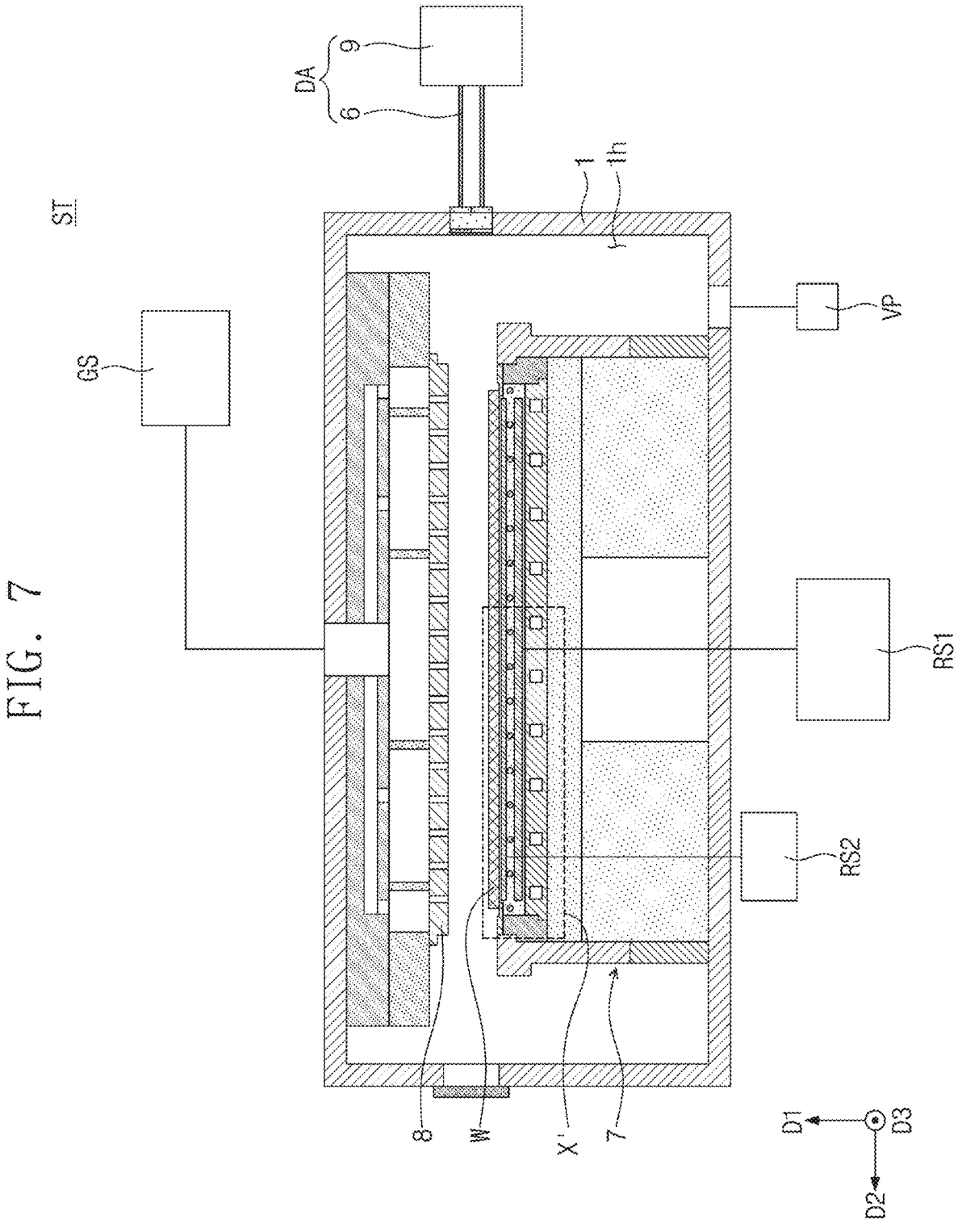
FIGS. 7 to 11 are views illustrating the example method of processing a substrate according to the flow chart of FIG. 5.
Figure 8:
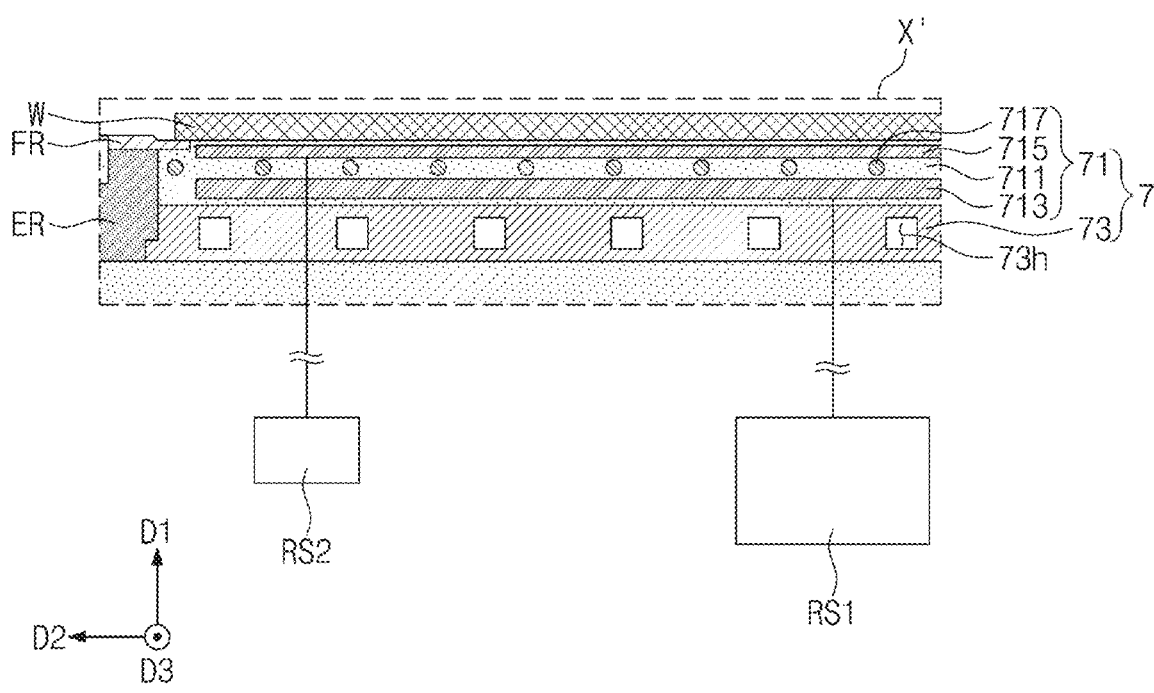
Figure 9:
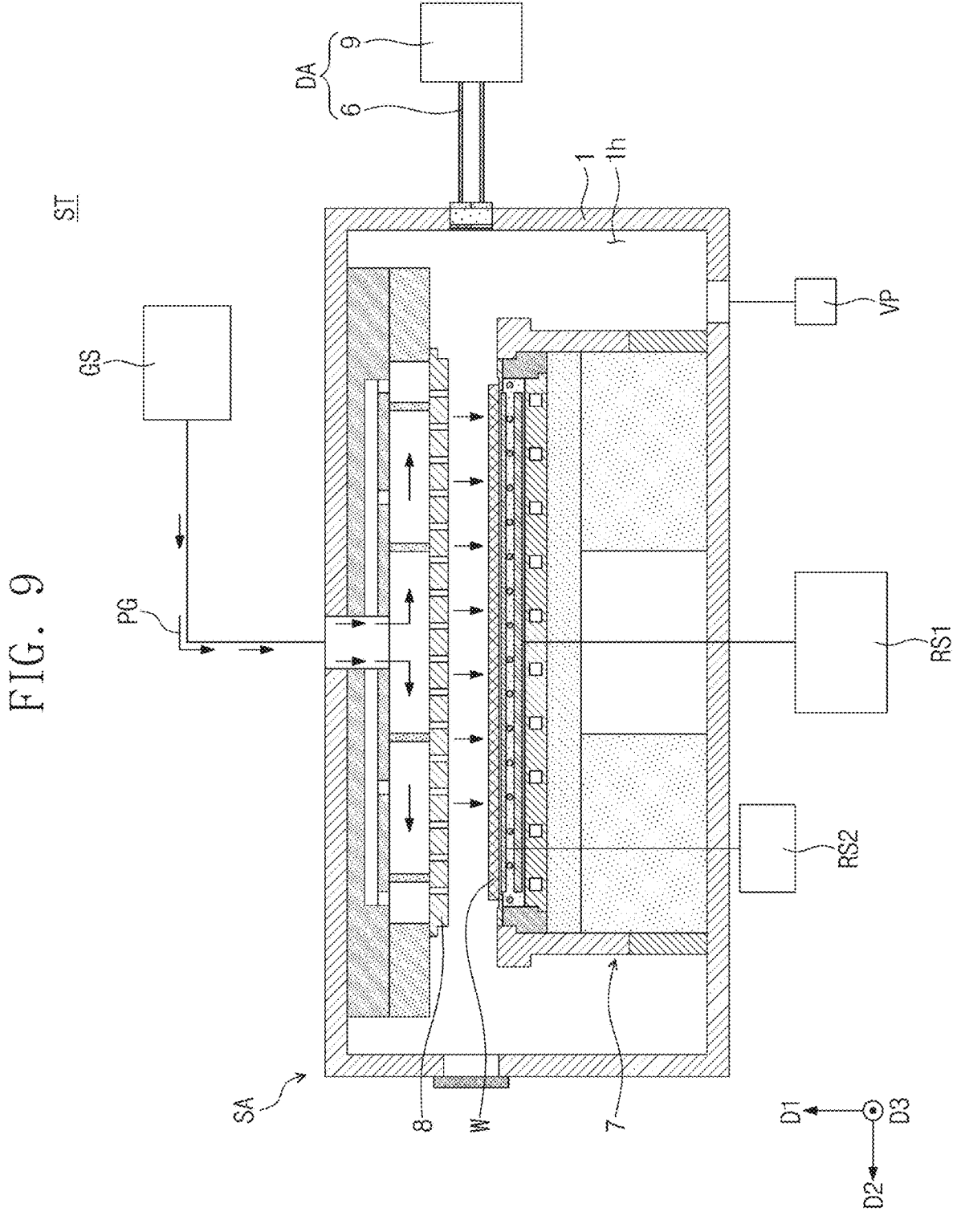
Figure 10:
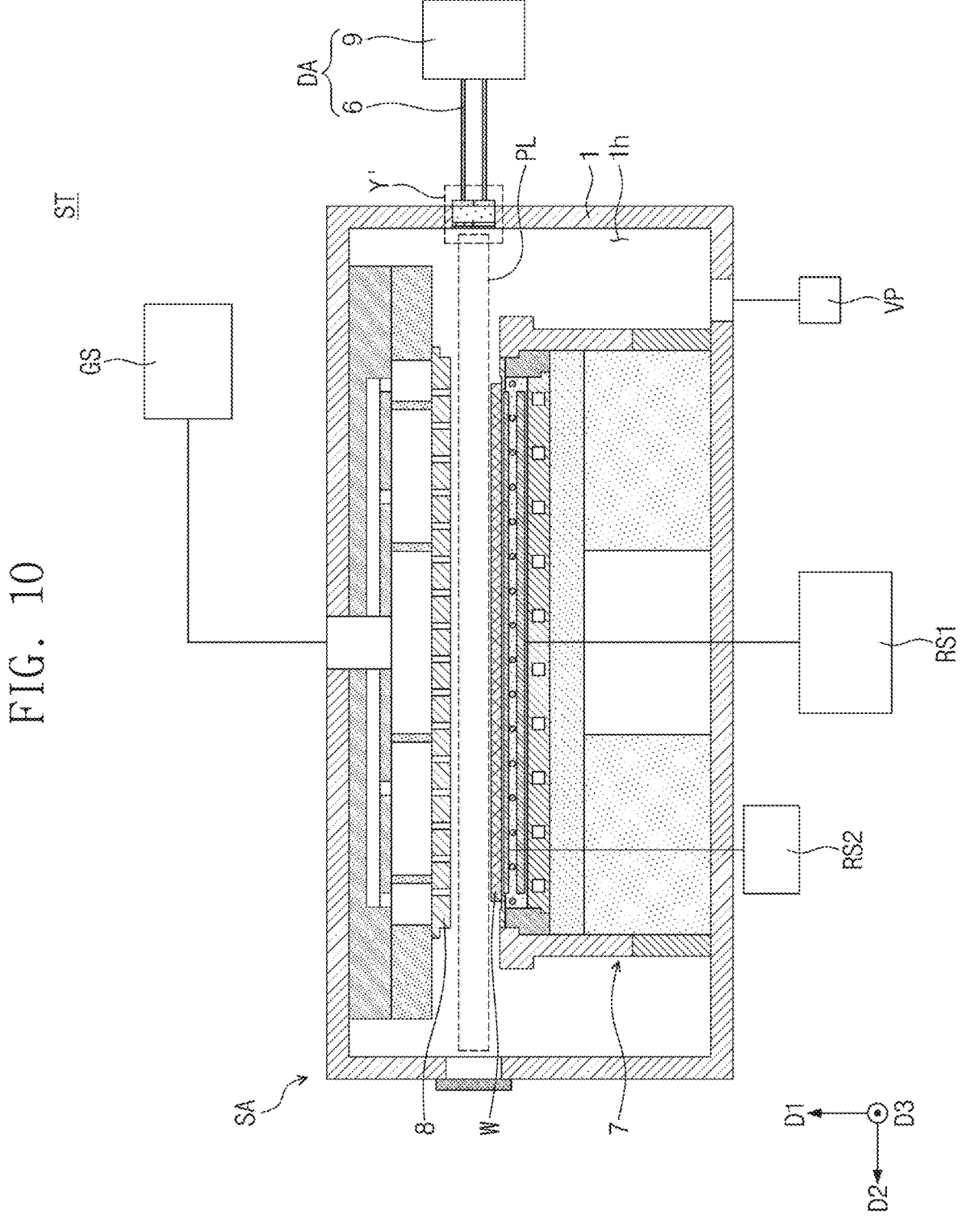

Referring to FIGS. 7, 8 and 5, the disposing of the substrate in the substrate processing apparatus (Sa1) may include disposing a substrate W on the stage 7. In a state in which the substrate W is disposed on the chuck body 711, a DC voltage may be applied to the chuck electrode 715. Thus, the substrate W may be held or fixed at a certain position on the chuck body 711. Referring to FIGS. 9, 10 and 5, the processing of the substrate using the plasma (Sa2) may include supplying a process gas PG into the process space 1h. In the state in which the process gas PG is supplied in the process space 1h, an electric field may be formed in the substrate processing apparatus SA. Thus, a portion of the process gas PG in the process space 1h may be converted into plasma PL. The substrate W may be processed by the plasma PL. For example, the substrate W may be etched and/or deposited with a layer by the plasma PL.

Figure 11:
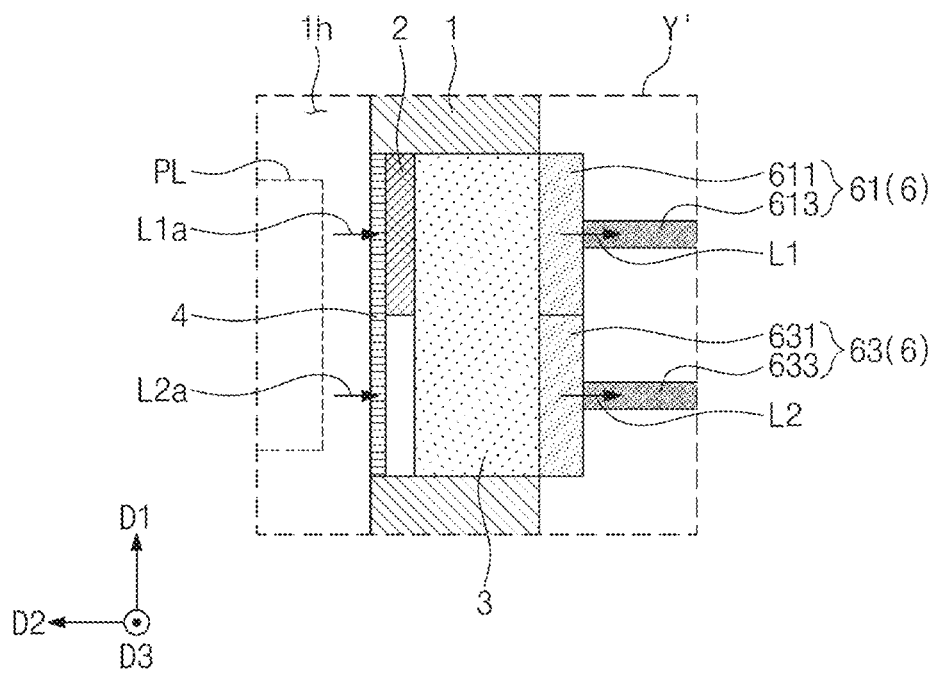

Referring to FIGS. 10, 11 and 6, the detecting of the first light transmitted through the scintillator layer (Sb11) may include detecting first light L1 of light emitted from the plasma PL. More particularly, a portion L1a of the light emitted from the plasma PL may pass through the scintillator layer 2. While the portion L1a of the light passes through the scintillator layer 2, VUV in the portion L1a of the light may be converted into visible light. Thus, the VUV may not exist in the first light L1 transmitted through the scintillator layer 2. The first light L1 transmitted through the scintillator layer 2 may be provided to the OES 9 through, for example, the window 3, the first collimator 611 and the first optical cable 613.

The detecting of the second light not transmitted through the scintillator layer (Sb12) may include detecting second light L2 of the light emitted from the plasma PL. More particularly, a portion L2a of the light emitted from the plasma PL may not pass through the scintillator layer 2. While the portion L2a of the light passes through the window 3, VUV in the portion L2a of the light may be absorbed into the window 3. Thus, the VUV may not exist in the second light L2 transmitted through the window 3. The second light L2 transmitted through the window 3 may be provided to the OES 9 through, for example, the second collimator 631 and the second optical cable 633.

Figure 12:
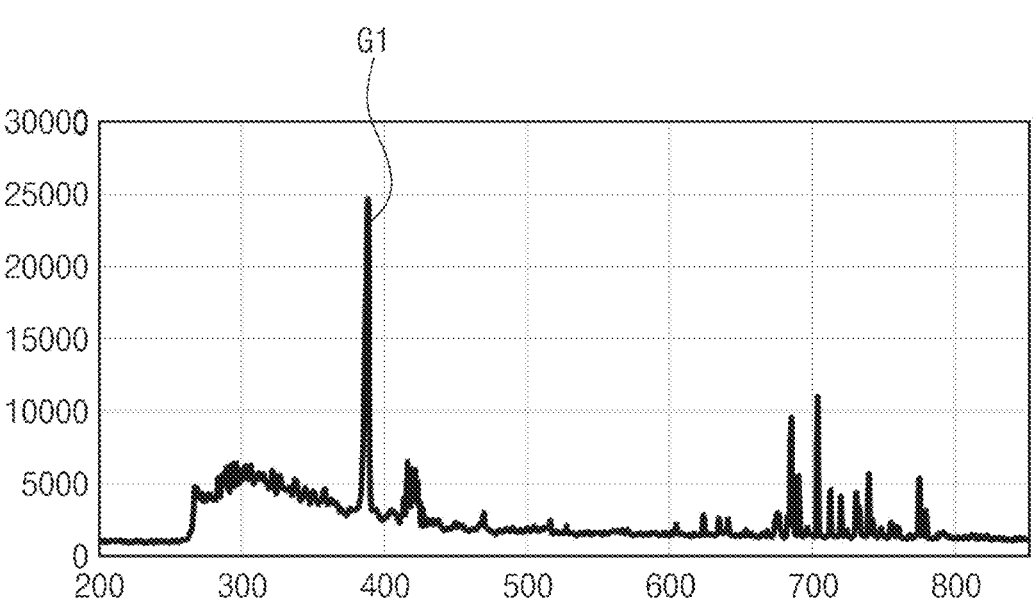
FIGS. 12 to 14 are graphs showing data obtained by the example method of processing a substrate according to the flow chart of FIG. 5.
Figure 13:
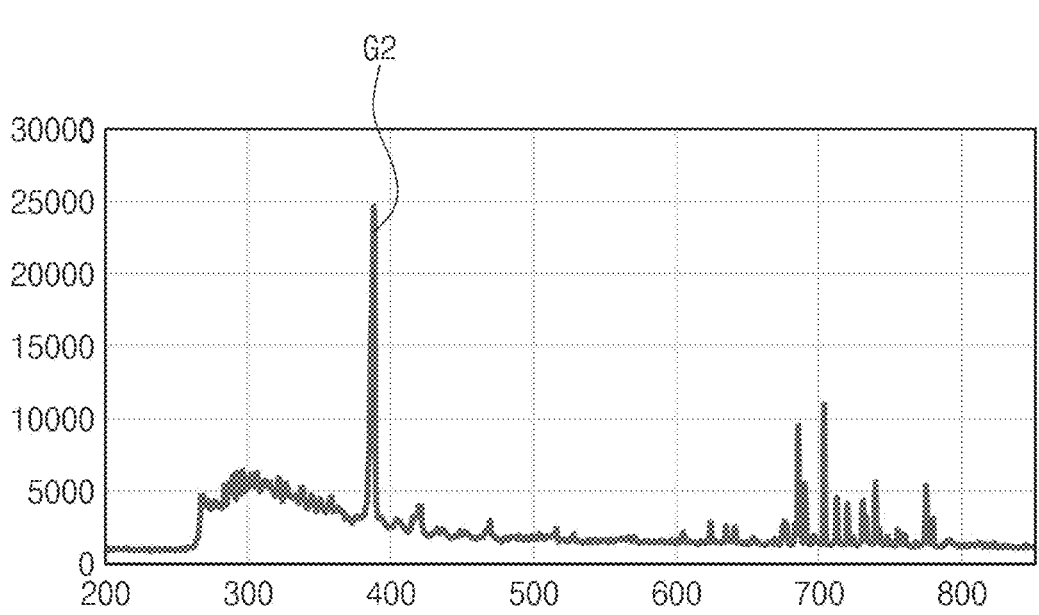
Figure 14:
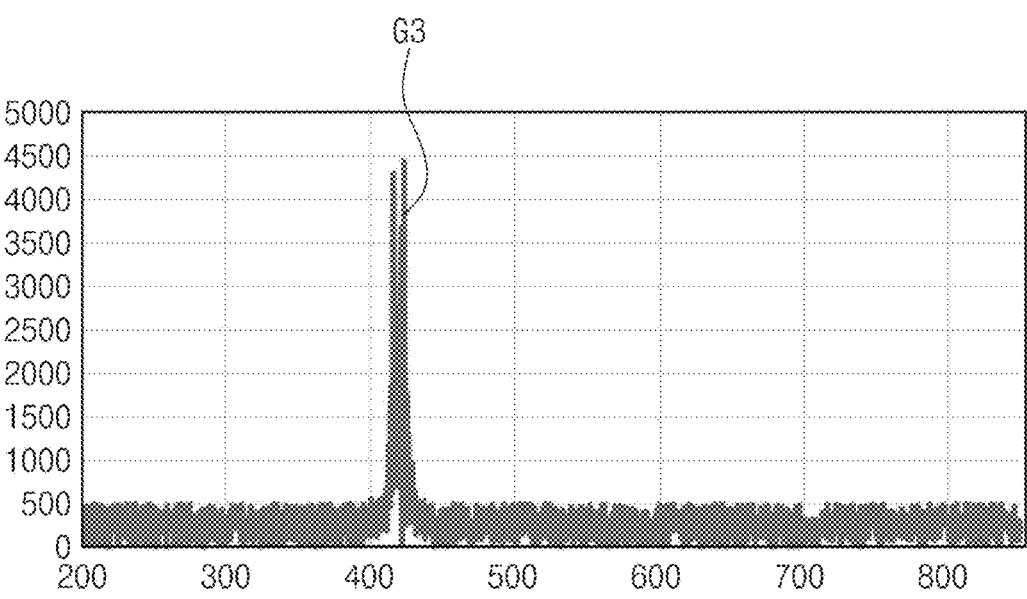

FIGS. 12 to 14 are graphs showing data obtained by the method of processing a substrate according to the flow chart of FIG. 5.

Referring to FIG. 12, a horizontal axis may represent a wavelength. A unit of the horizontal axis may be a nanometer (nm). A vertical axis may represent an intensity of light. A first graph G1 may mean the first light L1 (see FIG.

11) detected or measured by the OES 9. In other words, the first graph G1 may be data of the first light L1. For example, the first light L1 may be the visible light. More particularly, the first light L1 may include the visible light converted from the VUV, emitted from the plasma PL (see FIG. 11), by the scintillator layer 2 (see FIG. 11), and the visible light emitted from the plasma PL.

Referring to FIG. 13, a horizontal axis may represent a wavelength. A unit of the horizontal axis may be a nanometer (nm). A vertical axis may represent an intensity of light. A second graph G2 may mean the second light L2 (see FIG. 11) detected or measured by the OES 9. In other words, the second graph G2 may be data of the second light L2. For example, the second light L2 may be the visible light. More particularly, the second light L2 may include the visible light emitted from the plasma PL.

Referring to FIG. 14, a horizontal axis may represent a wavelength. A unit of the horizontal axis may be a nanometer (nm). A vertical axis may represent an intensity of light.

Referring to FIGS. 14 and 6, the analyzing of the light (Sb2) may include subtracting the data of the second light L2 from the data of the first light L1. A third graph G3 may be results obtained by subtracting the second graph G2 from the first graph G1. The third graph G3 may be data on the visible light converted from the VUV, emitted from the plasma PL, by the scintillator layer 2. Thus, data on the VUV emitted from the plasma PL may be obtained.

According to the substrate processing apparatus, the substrate processing system including the same, the method of detecting plasma using the system and the method of processing a substrate using the system in the embodiments of the inventive concepts, the VUV may be converted into the visible light by using the scintillator layer. More particularly, the scintillator layer may be coupled to the window to convert the VUV into the visible light. Thus, it may not be required to additionally install an additional vacuum system for detecting VUV. As a result, the VUV may be easily detected by a simple design change. In addition, the VUV may be converted into the visible light, and the converted visible light may be detected using the OES. Thus, the VUV may be checked or detected using the OES without an additional apparatus for sensing or detecting VUV.

According to the substrate processing apparatus, the substrate processing system including the same, the method of detecting plasma using the system and the method of processing a substrate using the system in the embodiments of the inventive concepts, the scintillator layer may be coupled to only a portion of the window, and another portion of the window may be exposed. Thus, the visible light except the VUV may be sensed or detected. In other words, both the VUV and the visible light may be detected by a simple design change.

According to the substrate processing apparatus, the substrate processing system including the same, the method of detecting plasma using the system and the method of processing a substrate using the system in the embodiments of the inventive concepts, a half of the window may be covered by the scintillator layer. In addition, the area of the first collimator may be substantially equal to the area of the second collimator. Furthermore, the area of the first optical cable may be substantially equal to the area of the second optical cable. Thus, except for the VUV converted into the visible light, the data of the first light may be substantially the same or similar as the data of the second light. As a result, accurate data on the VUV may be obtained.

Figure 15:
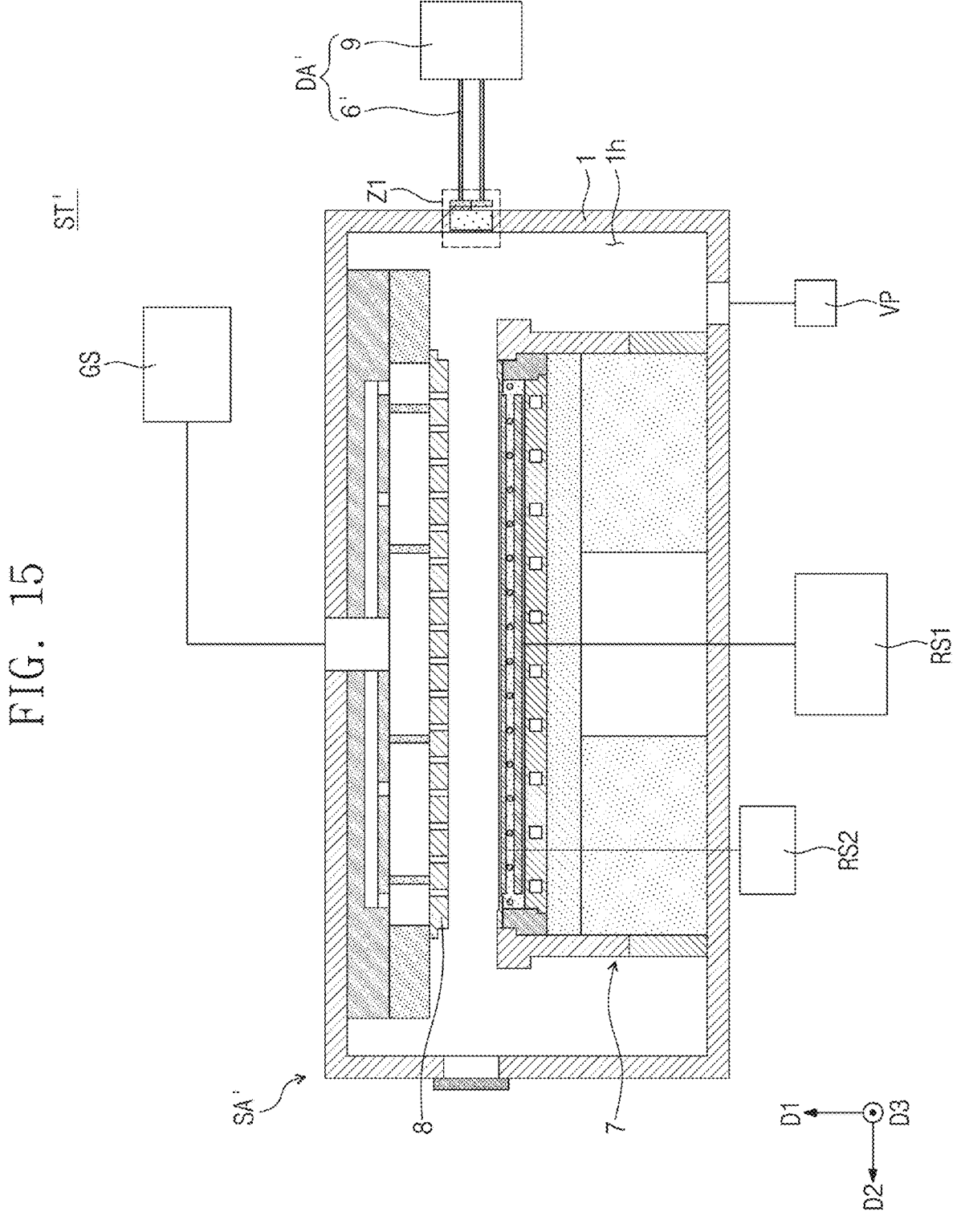
FIG. 15 is a cross-sectional view illustrating an example substrate processing system.
Figure 16:
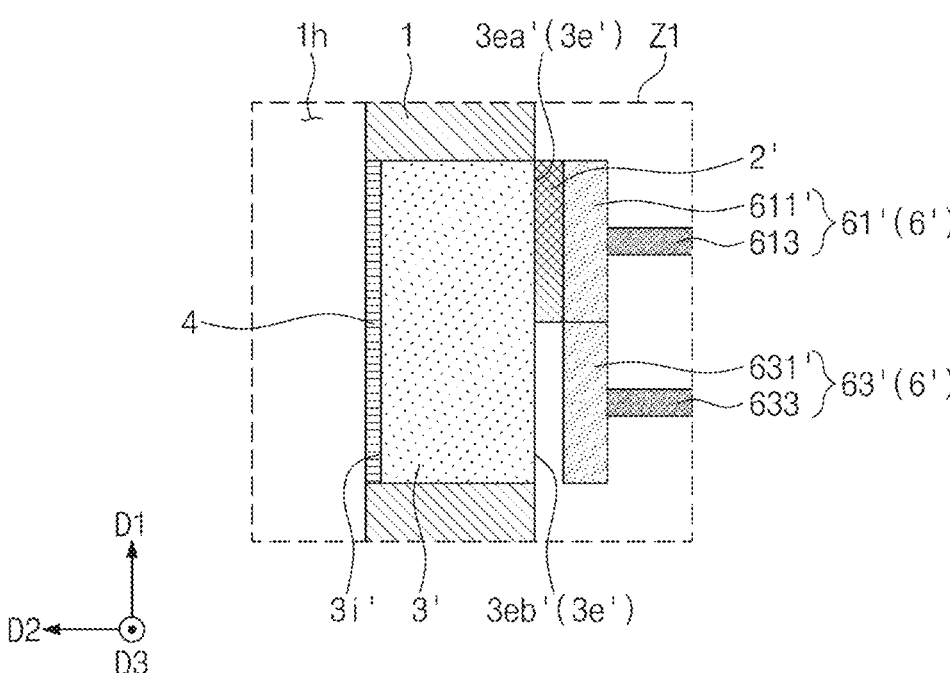
FIG. 16 is an enlarged cross-sectional view of a region 'Z1' of FIG. 15.

FIG. 15 is a cross-sectional view illustrating an exemplary substrate processing system, and FIG. 16 is an enlarged cross-sectional view of a region 'Z1' of FIG. 15.

Hereinafter, the descriptions to the same/similar features as mentioned with reference to FIGS. 1 to 14 will be omitted for the purpose of ease and convenience in explanation.

Referring to FIGS. 15 and 16, a substrate processing system ST' may be provided. The substrate processing system ST' may include a substrate processing apparatus SA' and a detection apparatus DA'.

The substrate processing apparatus SA' may include a window 3' and a scintillator layer 2'.

For example, the window 3' may include LiF and/or MgF$_2$. In this case, the window 3' may be configured to transmit VUV. In other words, the VUV generated in the process space 1$h$ may pass through the window 3'.

The scintillator layer 2' may be coupled to one side surface of the window 3'. For example, the scintillator layer 2' may be coupled to an outer side surface 3$e'$ of the window 3'. A portion of the outer side surface 3$e'$ of the window 3', covered by the scintillator layer 2', may be referred to as a first surface 3$ea'$. Another portion of the outer side surface 3$e'$ of the window 3', not covered by the scintillator layer 2', may be referred to as a second surface 3$eb'$. In this case, a first collimator 611' may be coupled to the scintillator layer 2'.

The window may include the material capable of transmitting the VUV. Thus, even though the scintillator layer is coupled to the outer side surface of the window, the VUV may reach the scintillator layer.

Figure 17:
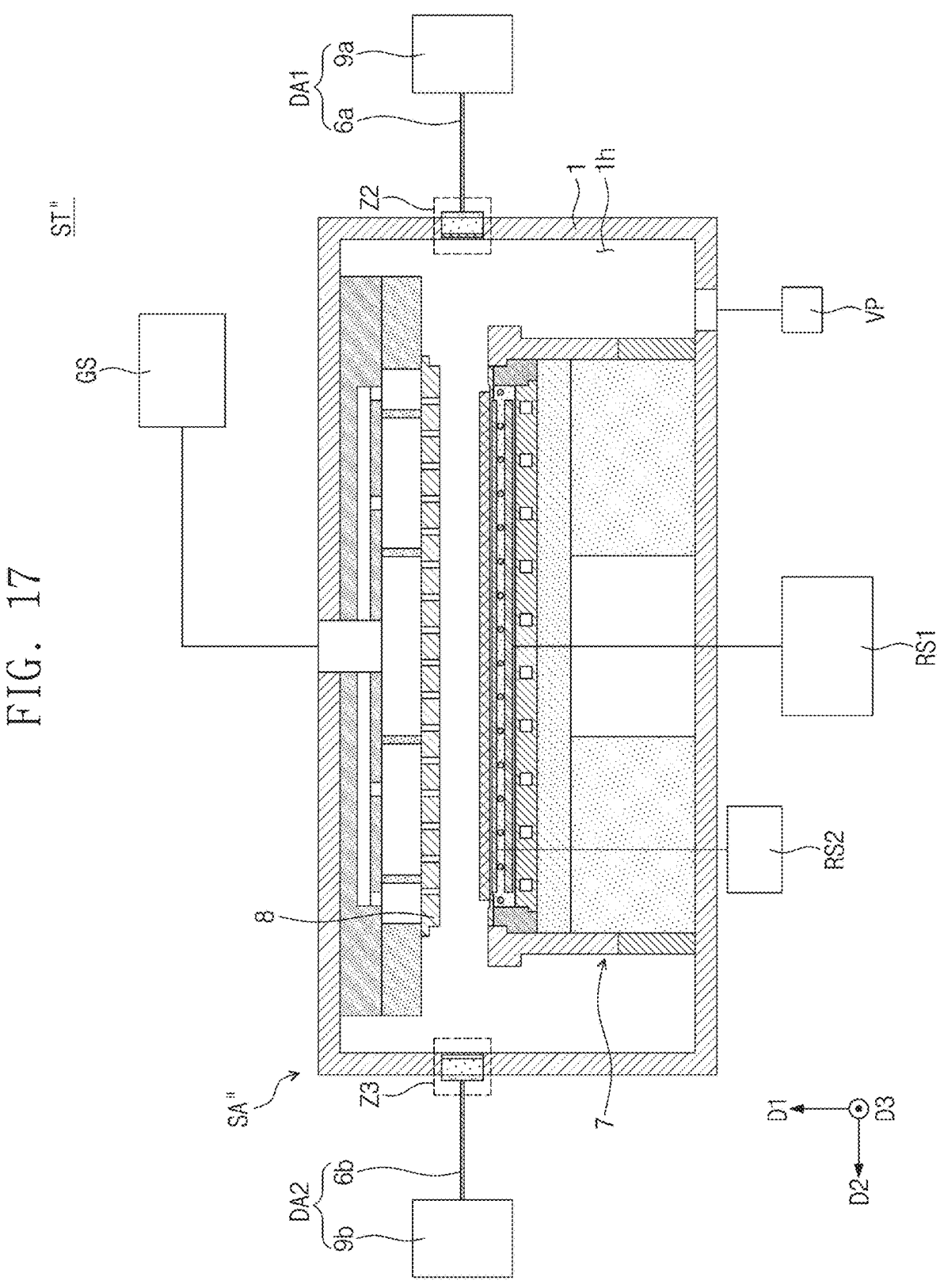
FIG. 17 is a cross-sectional view illustrating an example substrate processing system.
Figure 18:
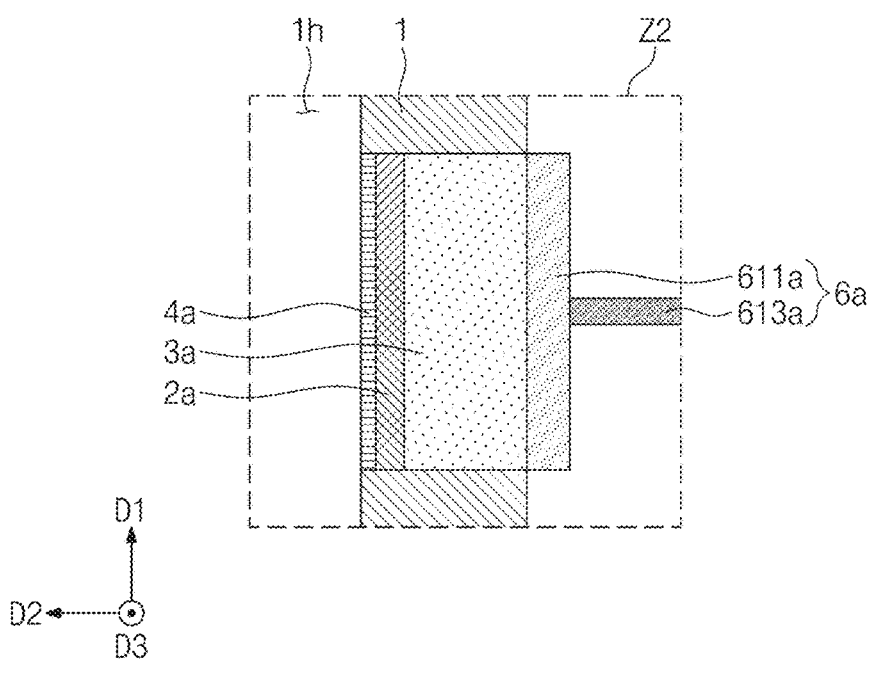
FIG. 18 is an enlarged cross-sectional view of a region 'Z2' of FIG. 17.
Figure 19:
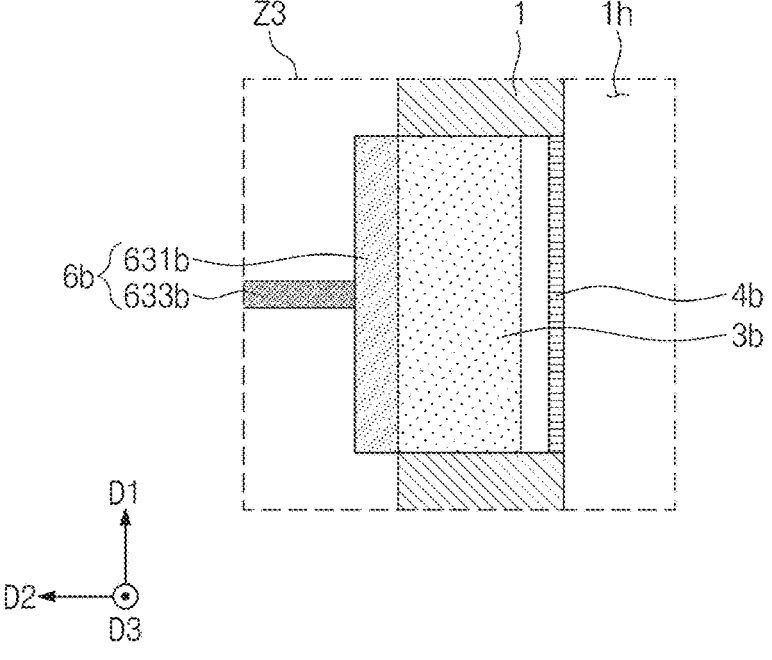
FIG. 19 is an enlarged cross-sectional view of a region 'Z3' of FIG. 17.

FIG. 17 is a cross-sectional view illustrating an example substrate processing system, FIG. 18 is an enlarged cross-sectional view of a region 'Z2' of FIG. 17, and FIG. 19 is an enlarged cross-sectional view of a region 'Z3' of FIG. 17.

Hereinafter, the descriptions to the same/similar features as mentioned with reference to FIGS. 1 to 16 will be omitted for the purpose of ease and convenience in explanation.

Referring to FIGS. 17, 18 and 19, a substrate processing system ST" may be provided. The substrate processing system ST" may include a substrate processing apparatus SA", a first detection apparatus DA1, and a second detection apparatus DA2.

The substrate processing apparatus SA" may include a first window 3$a$, a scintillator layer 2$a$, a first shield layer 4$a$, a second window 3$b$, and a second shield layer 4$b$. The first window 3$a$ and the second window 3$b$ may be spaced apart from each other. The scintillator layer 2$a$ may completely cover one side surface of the first window 3$a$.

The first detection apparatus DA1 may include a first light transmitting unit 6$a$ and a first OES 9$a$. The second detection apparatus DA2 may include a second light transmitting unit 6$b$ and a second OES 9$b$.

Two windows may be provided. One of the two windows may be used to detect the first light. The other of the two windows may be used to detect the second light.

Figure 20:
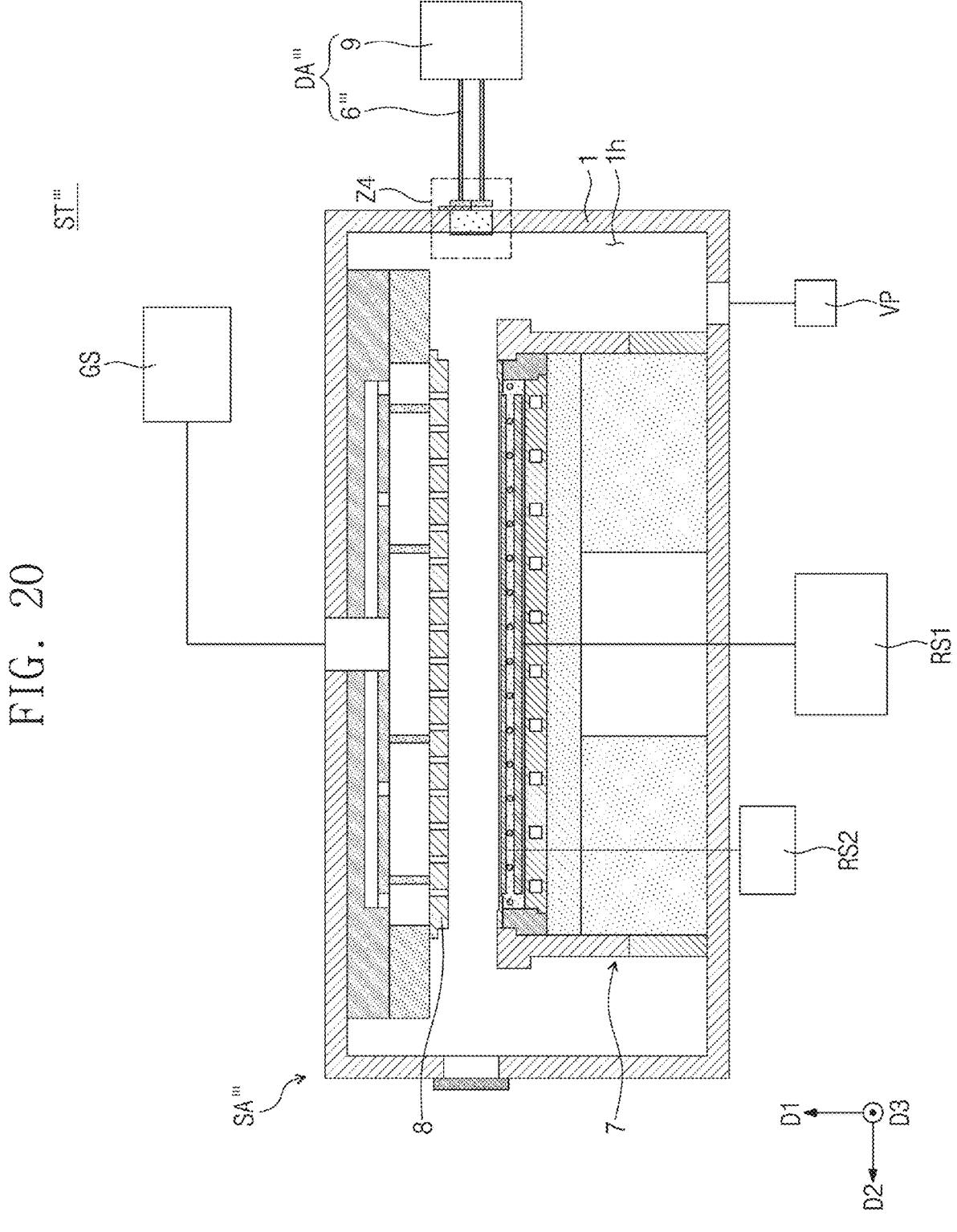
FIG. 20 is a cross-sectional view illustrating an example substrate processing system.
Figure 21:
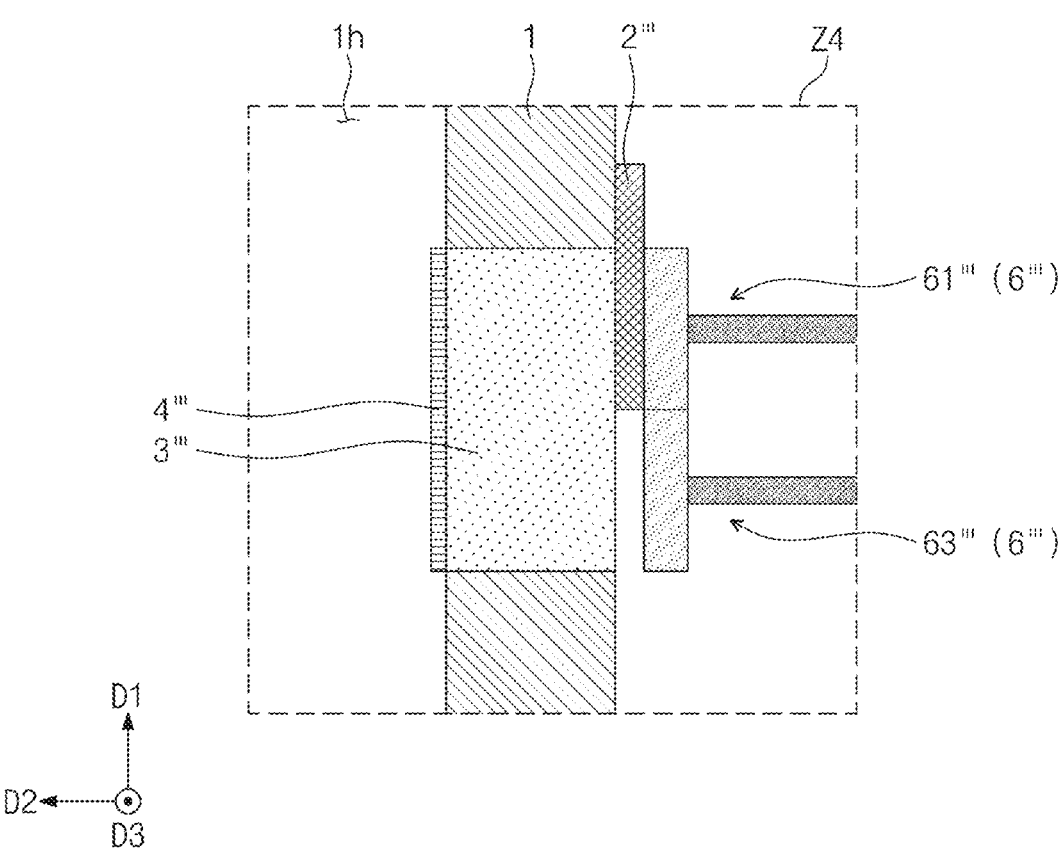
FIG. 21 is an enlarged cross-sectional view of a region 'Z4' of FIG. 20.

FIG. 20 is a cross-sectional view illustrating an example substrate processing system, and FIG. 21 is an enlarged cross-sectional view of a region 'ZA' of FIG. 20.

Hereinafter, the descriptions to the same/similar features as mentioned with reference to FIGS. 1 to 19 will be omitted for the purpose of ease and convenience in explanation.

Referring to FIGS. 20 and 21, a substrate processing system ST''' may be provided. The substrate processing system ST''' may include a substrate processing apparatus SA''' and a detection apparatus DA'''.

A portion of a scintillator layer 2''' may not be in contact with one side surface of a window 3'''. In this case, the portion of the scintillator layer 2''', which is not in contact with the one side surface of the window 3''', may be in contact with, for example, the process chamber 1.

The plasma may be monitored using the VUV light.

The VUV light may be detected using the OES.

The VUV light may be easily detected by the simple design change.

Both visible light and VUV light emitted from the plasma may be detected.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the embodiments of the inventive concepts have been particularly shown and described, it will be understood by one of ordinary skill in the art that variations in form and detail may be made therein without departing from the spirit and scope of the attached claims.

What is claimed is:

1. A substrate processing system comprising:
a substrate processing apparatus,
wherein the substrate processing apparatus comprises:
a process chamber providing a process space;
a stage located in the process chamber and configured to support a substrate;
a window coupled to a side of the process chamber and having a first surface and a second surface opposite the first surface; and
a scintillator layer coupled to the first surface of the window,
wherein a portion of the first surface of the window is covered by the scintillator layer, and an area of the portion is less than an area of the first surface of the window.

2. The substrate processing system of claim 1, wherein scintillator layer includes sodium salicylate (NaSal).

3. The substrate processing system of claim 1, wherein the first surface of the window is an inner side surface of the window and faces the process space.

4. The substrate processing system of claim 3, wherein the window includes quartz.

5. The substrate processing system of claim 3, wherein the substrate processing apparatus further comprises:
a shield layer between the window and the process space,
wherein the shield layer covers a second portion of the first surface and an inner side surface of the scintillator layer.

6. The substrate processing system of claim 1, wherein the first surface of the window is an outer side surface of the window opposite the second, process-space-facing surface of the window, and
wherein the window includes LiF or MgF2.

7. The substrate processing system of claim 1, wherein an area of the portion is substantially equal to an area of a second portion of the first surface of the window, wherein the second portion is uncovered by the scintillator layer.

8. The substrate processing system of claim 1, further comprising a detection apparatus configured to detect a plasma in a process space.

9. A substrate processing system comprising:
a substrate processing apparatus; and
a detection apparatus configured to detect a plasma in a process space,
wherein the substrate processing apparatus comprises:
a process chamber providing the process space;
a window coupled to the process chamber; and
a scintillator layer used to convert vacuum ultraviolet light emitted from the plasma in the process space into visible light,
wherein the detection apparatus comprises:
a first light transmitting unit coupled to the substrate processing apparatus and configured to transmit a first portion of light emitted from the plasma in the process space and transmitted through the scintillator layer and through the window; and
a second light transmitting unit coupled to the substrate processing apparatus and configured to transmit a second portion of the light emitted from the plasma in the process space and transmitted through the window but not transmitted through the scintillator layer.

10. The substrate processing system of claim 9, wherein the detection apparatus further comprises: an optical emission spectrometer (OES) used to detect the light emitted from the plasma in the process space,
wherein the first light transmitting unit comprises:
a first collimator coupled to the window; and
a first optical cable connecting the first collimator to the OES.

11. The substrate processing system of claim 10, wherein the second light transmitting unit comprises:
a second collimator coupled to the window; and
a second optical cable connecting the second collimator to the OES.

12. The substrate processing system of claim 11, wherein the scintillator layer is coupled to the window and covers a portion of one side surface of the window, and
wherein the one side surface of the window comprises:
a first surface covered by the scintillator layer; and
a second surface not covered by the scintillator layer.

13. The substrate processing system of claim 12, wherein the one side surface of the window is an inner side surface of the window and faces the process space, and
wherein the window includes quartz.

14. The substrate processing system of claim 13, wherein the substrate processing apparatus further comprises:
a shield layer between the window and the process space,
wherein the shield layer covers a second portion of the first surface and an inner side surface of the scintillator layer.

15. The substrate processing system of claim 12, wherein the one side surface of the window is an outer side surface of the window opposite to an inner, process-space-facing side surface of the window,
wherein the first collimator is coupled to the scintillator layer, and
wherein the second collimator is coupled to the second surface.

16. The substrate processing system of claim 15, wherein the window includes LiF or MgF2.

17. The substrate processing system of claim 11, wherein a contact area between the first optical cable and the OES is substantially equal to a contact area between the second optical cable and the OES.

18. The substrate processing system of claim 11, wherein the OES includes a 2-channel OES.

19. The substrate processing system of claim 10, wherein an area of the scintillator layer is greater than an area of the first optical cable.

20. The substrate processing system of claim 9, wherein the scintillator layer includes sodium salicylate (NaSal).

\* \* \* \* \*